United States Patent
Tung et al.

(10) Patent No.: US 9,496,176 B1
(45) Date of Patent: Nov. 15, 2016

(54) SEMICONDUCTOR DEVICE

(71) Applicant: UNITED MICROELECTRONICS CORP., Hsin-Chu (TW)

(72) Inventors: Yu-Cheng Tung, Kaohsiung (TW); En-Chiuan Liou, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/176,142

(22) Filed: Jun. 7, 2016

Related U.S. Application Data

(62) Division of application No. 14/691,586, filed on Apr. 21, 2015, now Pat. No. 9,397,008.

(51) Int. Cl.
*H01L 21/768* (2006.01)
*H01L 29/417* (2006.01)
*H01L 29/78* (2006.01)
*H01L 29/66* (2006.01)

(52) U.S. Cl.
CPC ... *H01L 21/76897* (2013.01); *H01L 29/41783* (2013.01); *H01L 29/66795* (2013.01); *H01L 29/785* (2013.01)

(58) Field of Classification Search
CPC .............. H01L 21/76898; H01L 21/823437; H01L 21/0274; H01L 21/31111; H01L 21/31144; H01L 21/32139; H01L 21/823418; H01L 21/823475
See application file for complete search history.

(56) References Cited

U.S. PATENT DOCUMENTS

| | | | |
|---|---|---|---|
| 5,949,143 A | 9/1999 | Bang | |
| 2001/0024380 A1* | 9/2001 | Goebel | B82Y 10/00 365/158 |
| 2002/0121657 A1* | 9/2002 | Chen | H01L 27/115 257/296 |
| 2010/0133699 A1 | 6/2010 | Werner | |
| 2010/0327357 A1* | 12/2010 | Jang | H01L 21/84 257/350 |
| 2011/0156140 A1* | 6/2011 | Zara | H01L 21/2815 257/334 |
| 2011/0159677 A1* | 6/2011 | Lee | H01L 21/32139 438/586 |
| 2011/0220996 A1* | 9/2011 | Kutsukake | H01L 21/76229 257/336 |
| 2011/0303967 A1 | 12/2011 | Harari | |
| 2012/0018797 A1* | 1/2012 | Yu | H01L 21/28518 257/324 |
| 2013/0285157 A1 | 10/2013 | Yin | |
| 2014/0117455 A1 | 5/2014 | Liu | |
| 2014/0264709 A1* | 9/2014 | Tsai | H01L 23/481 257/459 |
| 2015/0044870 A1 | 2/2015 | Cheng | |
| 2015/0064863 A1 | 3/2015 | Adusumilli | |
| 2015/0228574 A1* | 8/2015 | Kim | H01L 21/76895 257/773 |
| 2015/0364378 A1 | 12/2015 | Xie | |
| 2016/0064281 A1 | 3/2016 | Izumi | |

* cited by examiner

*Primary Examiner* — Mamadou Diallo
(74) *Attorney, Agent, or Firm* — Winston Hsu; Scott Margo

(57) ABSTRACT

A semiconductor device includes a semiconductor structure, a plurality of gate structures, at least one source/drain structure, at least one trench, a dielectric pattern, and a conductive structure. The gate structures are disposed on the semiconductor structure. The source/drain structure is disposed between two adjacent gate structures. The trench is disposed between the two adjacent gate structures and corresponding to the source/drain structure. The dielectric pattern is disposed on sidewalls of the trench. The conductive structure is disposed in the trench and electrically connected to the source/drain structure. The conductive structure includes a first portion surrounded by the dielectric pattern and a second portion connected to the source/drain structure, and the first portion is disposed on the second portion. A width of the first portion is smaller than a width of the second portion.

5 Claims, 14 Drawing Sheets

US 9,496,176 B1

SEMICONDUCTOR DEVICE

CROSS REFERENCE TO RELATED APPLICATIONS

This application is a division of application Ser. No. 14/691,586 filed on Apr. 21, 2015, now allowed, which is incorporated by reference herein in its entirety.

BACKGROUND OF THE INVENTION

1. Field of the Invention

The present invention relates to a semiconductor device, and more particularly, to a semiconductor device including a self-aligned conductive structure.

2. Description of the Prior Art

The development of semiconductor integrated circuit technology progresses continuously and circuit designs in products of the new generation become smaller and more complicated than those of the former generation. The amount and the density of the functional devices in each chip region are increased constantly according to the requirements of innovated products, and the size of each device has to become smaller accordingly. For example, in field effect transistors, the spacing between gate lines becomes smaller for enhancing the integrity of the integrated circuit. However, it is difficult to form conductive plugs in the extremely small space between the gate lines because of the exposure limitation of the photolithography process, and mis-alignments occurred in the photolithography process for forming the conductive plugs between the gate lines may result in yield loss because the process window is too limited.

SUMMARY OF THE INVENTION

According to the claimed invention, a semiconductor device is provided. The semiconductor device includes a semiconductor structure, a plurality of gate structures, at least one source/drain structure, at least one trench, a dielectric pattern, and a conductive structure. The gate structures are disposed on the semiconductor structure. The source/drain structure is disposed between two adjacent gate structures. The trench is disposed between the two adjacent gate structures and corresponding to the source/drain structure. The dielectric pattern is disposed on sidewalls of the trench. The conductive structure is disposed in the trench and electrically connected to the source/drain structure. The conductive structure includes a first portion surrounded by the dielectric pattern and a second portion connected to the source/drain structure, and the first portion is disposed on the second portion. A width of the first portion is smaller than a width of the second portion.

According to the manufacturing method of the conductive structure in the semiconductor device, the conductive structure between the gate structures may be formed and self-aligned because the air void is formed in the space between the gate structures before the opening penetrating the second dielectric layer is formed. The manufacturing yield and the process window may be enhanced accordingly.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-9 are schematic drawings illustrating a manufacturing method of a conductive structure in a semiconductor device according to a first embodiment of the present invention, wherein
FIG. 2 is a schematic top view drawing of FIG. 1,
FIG. 3 is a schematic drawing in a step subsequent to FIG. 1,
FIG. 4 is a schematic drawing in a step subsequent to FIG. 3,
FIG. 5 is a schematic drawing in a step subsequent to FIG. 4,
FIG. 6 is a schematic drawing illustrating a position relation between a first open pattern and second open patterns,
FIG. 7 is a schematic drawing in a step subsequent to FIG. 5,
FIG. 8 is a schematic drawing in a step subsequent to FIG. 7,
and
FIG. 9 is a schematic cross-sectional drawing taken along a line A-A' in FIG. 8.
FIGS. 11-13 are schematic drawings illustrating a manufacturing method of a conductive structure in a semiconductor device according to a third embodiment of the present invention, wherein
FIG. 12 is a schematic drawing in a step subsequent to FIG. 11,
and
FIG. 13 is a schematic drawing in a step subsequent to FIG. 12.

DETAILED DESCRIPTION

Figure 1:
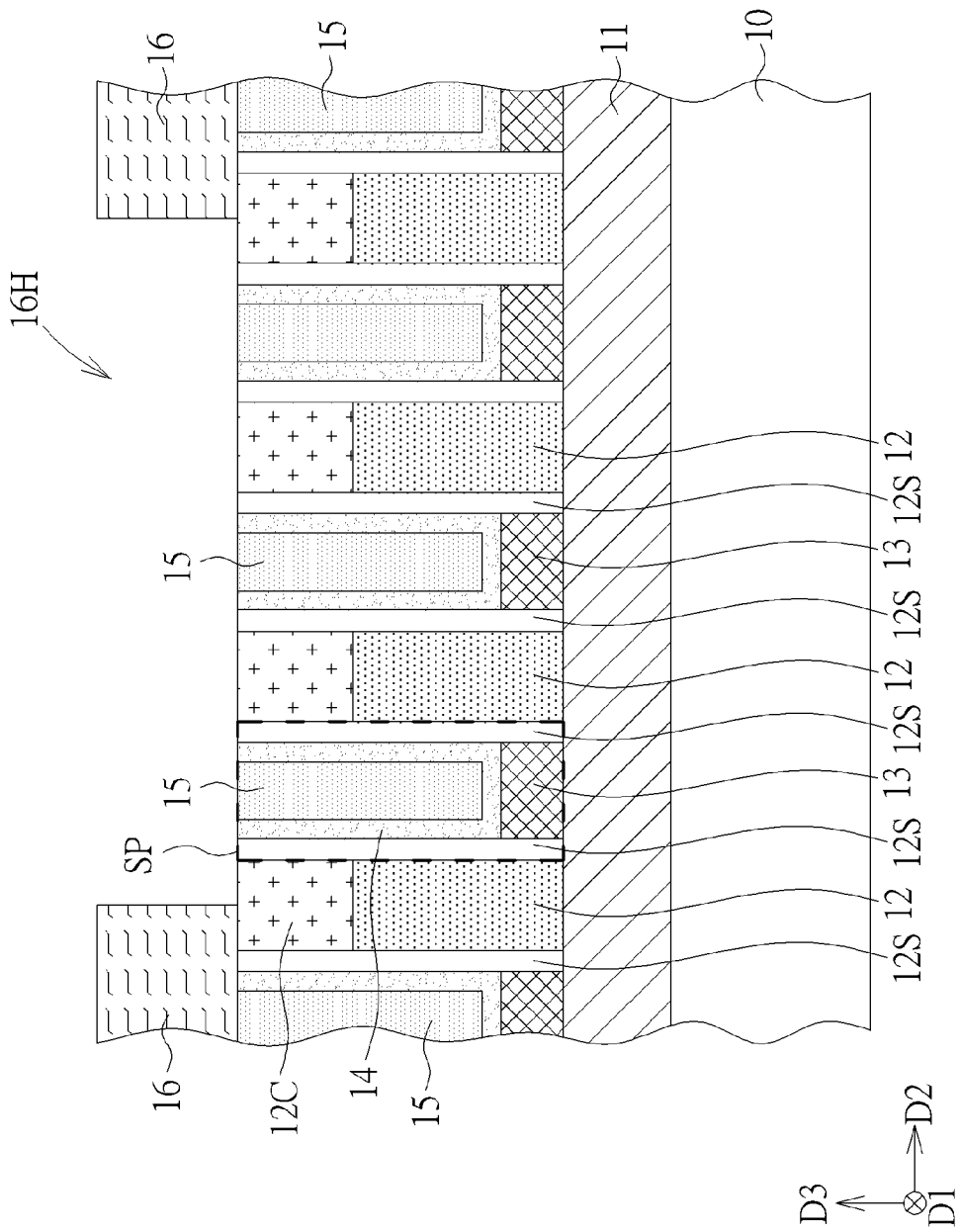
Figure 2:
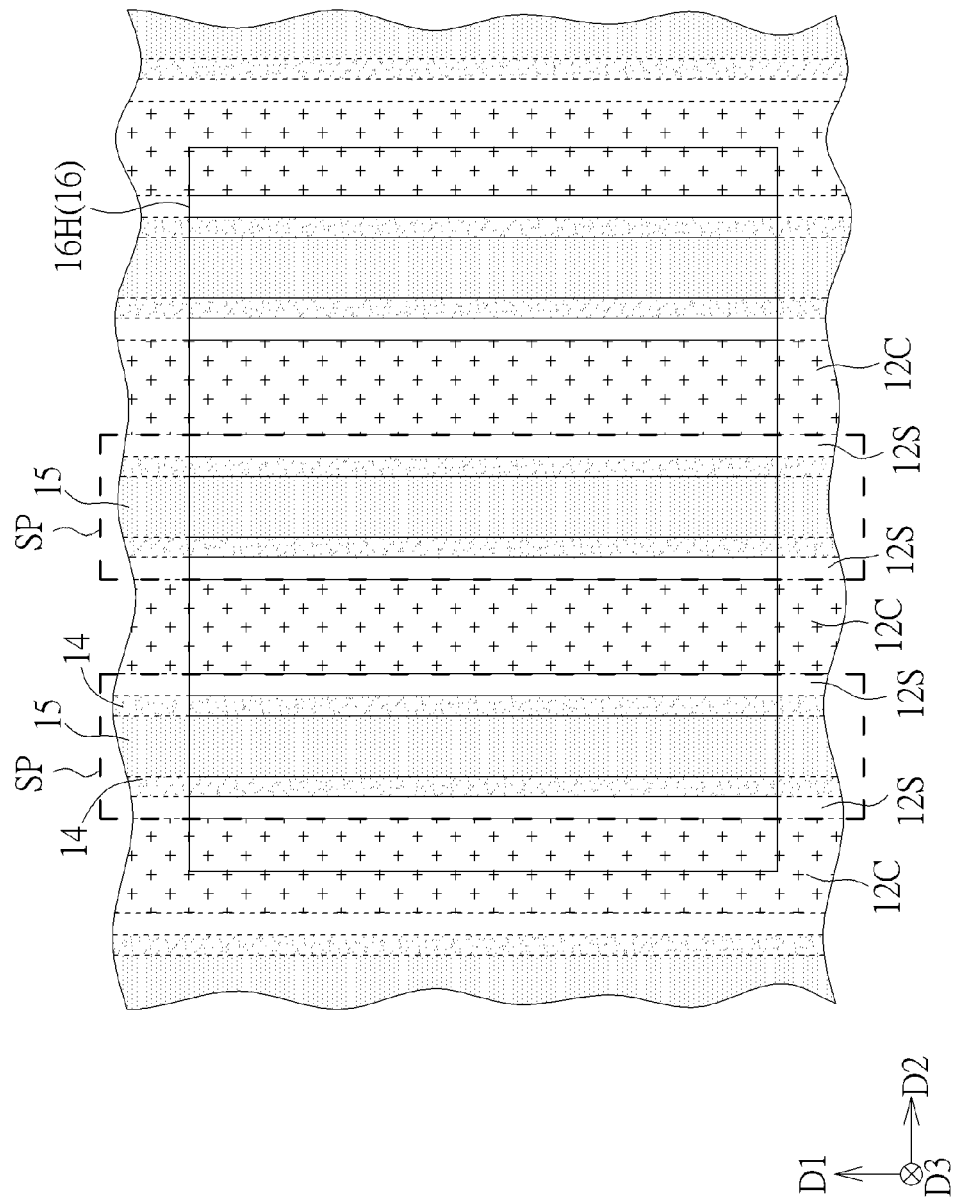

Please refer to FIGS. 1-9. FIGS. 1-9 are schematic drawings illustrating a manufacturing method of a conductive structure in a semiconductor device according to a first embodiment of the present invention. The manufacturing method of the conductive structure in this embodiment includes the following steps. As shown in FIG. 1 and FIG. 2, a semiconductor structure 11 is formed on a substrate 10. The substrate 10 may include a silicon substrate, an epitaxial silicon substrate, a silicon germanium substrate, a silicon carbide substrate, or a silicon-on-insulator (SOI) substrate, but not limited thereto. The semiconductor structure 11 may be a semiconductor layer, a semiconductor fin structure, or other appropriate semiconductor structures. A plurality of gate structures 12 are formed on the semiconductor structure 11. In this embodiment, the gate structures 12 may include gate lines extending in a first direction D1, but not limited thereto. The gate structures 12 are disposed parallel to one another and repeatedly in a second direction D2. The first direction D1 is substantially perpendicular to the second direction D2, but not limited thereto. A first dielectric layer 15 is formed in space SP between the gate structures 12. In this embodiment, the gate structures 12 may include metal gate structures formed by a replacement metal gate process, but not limited thereto. A gate insulating layer (not shown) may be disposed between the metal gate structures and the semiconductor structure 11. In addition, sidewall spacers 12S may be formed on two sidewalls of each gate structure 12 in the second direction D2, at least one source/drain structure 13 may be formed between two adjacent gate structures 12, and a contact etching stop layer 14 may be selectively formed in the space SP between the gate structures 12 and cover the source/drain structure 13. The material of the sidewall spacers 12S may include silicon nitride (SiN), silicon carbide nitride (SiCN), silicon-carbon-oxy-nitride (SiCON), or other appropriate insulating materials. The material of the contact etching stop layer 14 may include silicon nitride (SiN) or other appropriate insulating materials. In this embodiment, the source/drain structure 13 may include an epitaxial layer, a silicide layer, a doped region in the semiconductor structure 11, or other appropriate types of source/drain structures. The contact etching stop layer 14 covers the source/drain structure 13 and partially disposed between the source/drain structure 13 and the first dielectric layer 15 in a vertical direction D3. Additionally, a protection layer 12C may be selectively formed on the gate structure 12, and a part of the sidewall spacers 12S may be formed on two sidewalls of the protection layer 12C in the second direction D2, but not limited thereto.

Figure 3:
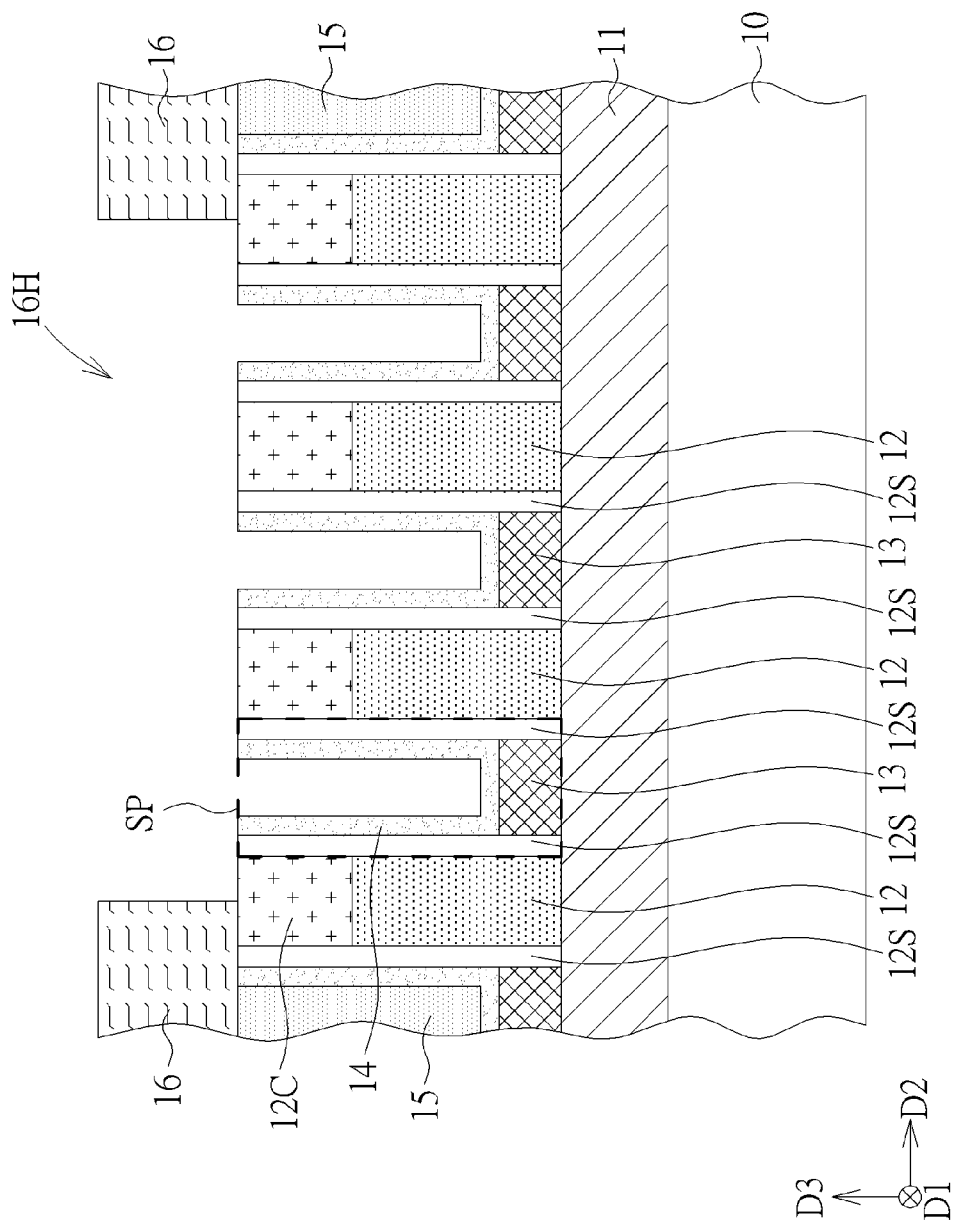

As shown in FIGS. 1-3, a first process is then performed to remove at least a part of the first dielectric layer 15 in the space SP between the gate structures 12. Specifically, the first process may include forming a first patterned mask 16 on the gate structures 12, and the first patterned mask 16 includes at least one first open pattern 16H corresponding to a plurality of the spaces SP between the gate structures 12. For example, as shown in FIG. 1 and FIG. 2, the first open pattern 16H is formed corresponding to three spaces SP between the gate structures 12, and the first dielectric layers 15 in these three spaces SP are exposed by the first open pattern 16H. The first patterned mask 16 may be a patterned photoresist layer formed by a photolithography process, but not limited thereto. Subsequently, an etching process may be performed to remove the first dielectric layers 15 in the spaces SP exposed by the first patterned mask 16. The etching process in the first process may include an anisotropic etching process or an isotropic etching process. Preferably, the etching process in the first process may be a wet etching process with appropriate etching selectivity, so as to avoid damaging other parts which are not intended to be etched in the first process, such as the protection layer 12C and the contact etching stop layer 14, but not limited thereto. Additionally, the first dielectric layer 15 may be a spin-on glass (SOG) material preferably, and the SOG material may then be quickly removed by the wet etching process mentioned above. The etching selectivity of the wet etching process for the SOG material to the metal material of the gate structure 12 may range between 1:100 and 1:500, and the etching selectivity of the wet etching process for the SOG material to silicon oxide may range between 1:15 and 1:40, but not limited thereto. Therefore, the contact etching stop layer 14 still covers the source/drain structure 13 after the first process preferably.

As shown in FIGS. 1-3, the first open pattern 16H in the first patterned mask 16 is formed corresponding to a plurality of the spaces SP between the gate structures 12. Therefore, when the dimension of the space SP between the gate structures 12 becomes extremely small and narrow, the first open pattern 16H in the first patterned mask 16 may still be relatively large and that is a benefit for the process forming the first patterned mask 16. For example, a photolithography process with relatively lower exposure resolution may be applied to form the first patterned mask 16. Additionally, the first open pattern 16H is not necessary to be exactly aligned with the spaces SP, and the first open pattern 16H may expose a part of the protection layer 12C on the gate structure 12. The alignment tolerance of the process forming the first patterned mask 16 may become larger, and the process window may be improved accordingly.

Figure 4:
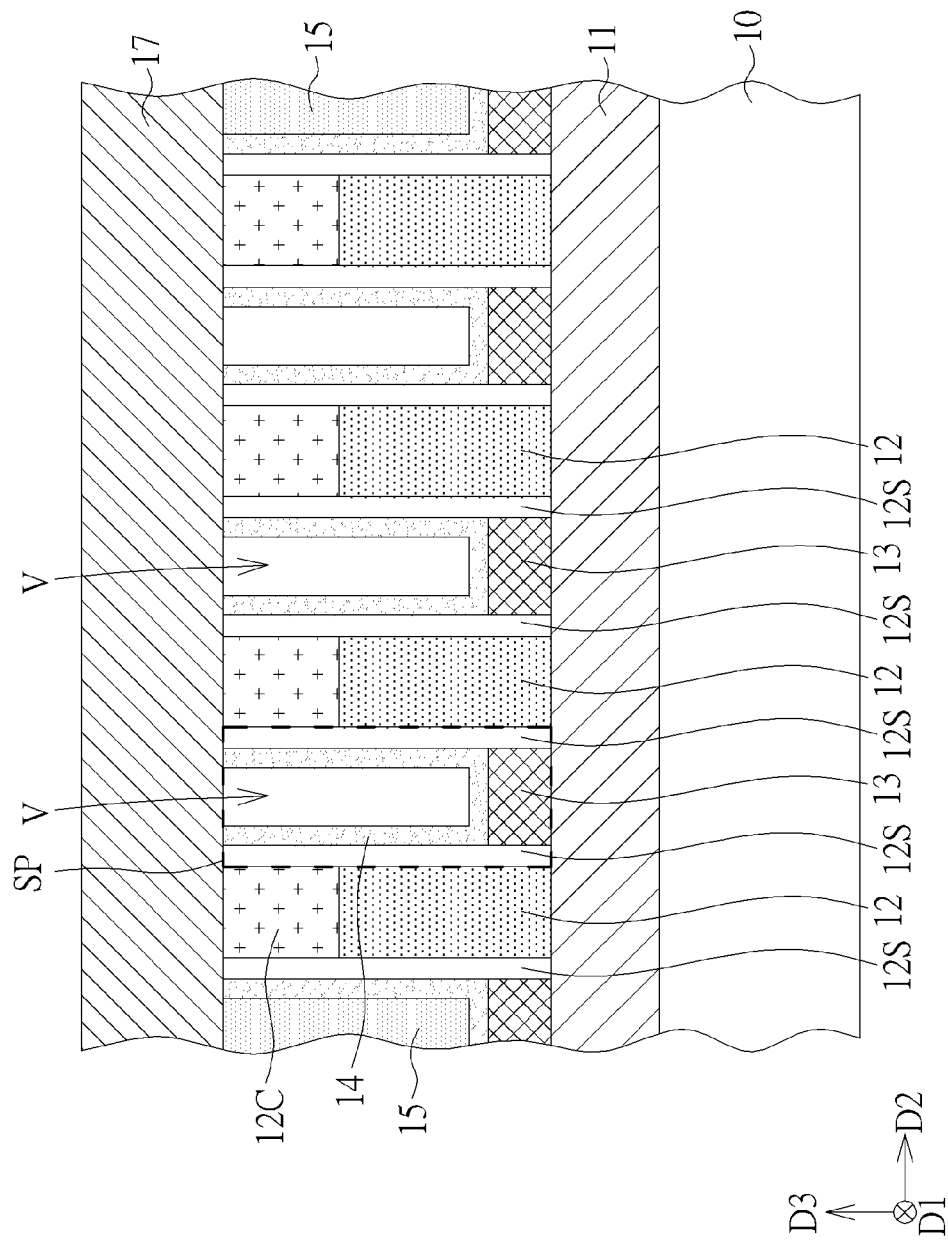

The first patterned mask 16 is then removed. As shown in FIG. 4, a second dielectric layer 17 is then formed and covers the gate structures 12 so as to form at least one air void V in the space SP between the gate structures 12. The air void V is formed above and corresponding to the source/drain structure 13. The second dielectric layer 17 may be a single layer or a multiple-layered structure, and the materials or/and the forming process of the second dielectric layer 17 may be modified for presenting worse gap fill ability. For example, the second dielectric layer 17 may be formed by chemical vapor deposition for keeping the air void V in the space SP, but not limited thereto.

Figure 5:
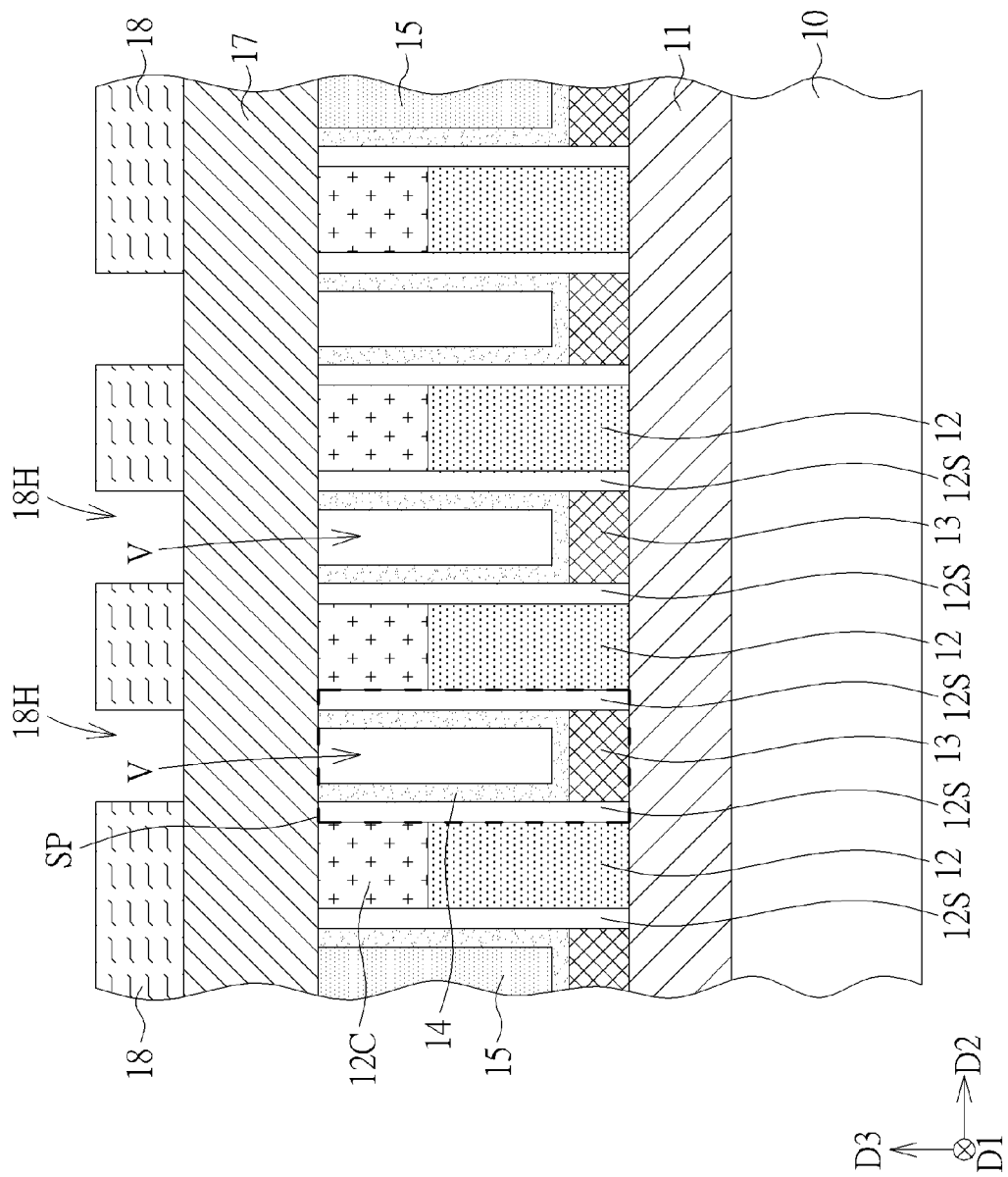
Figure 6:
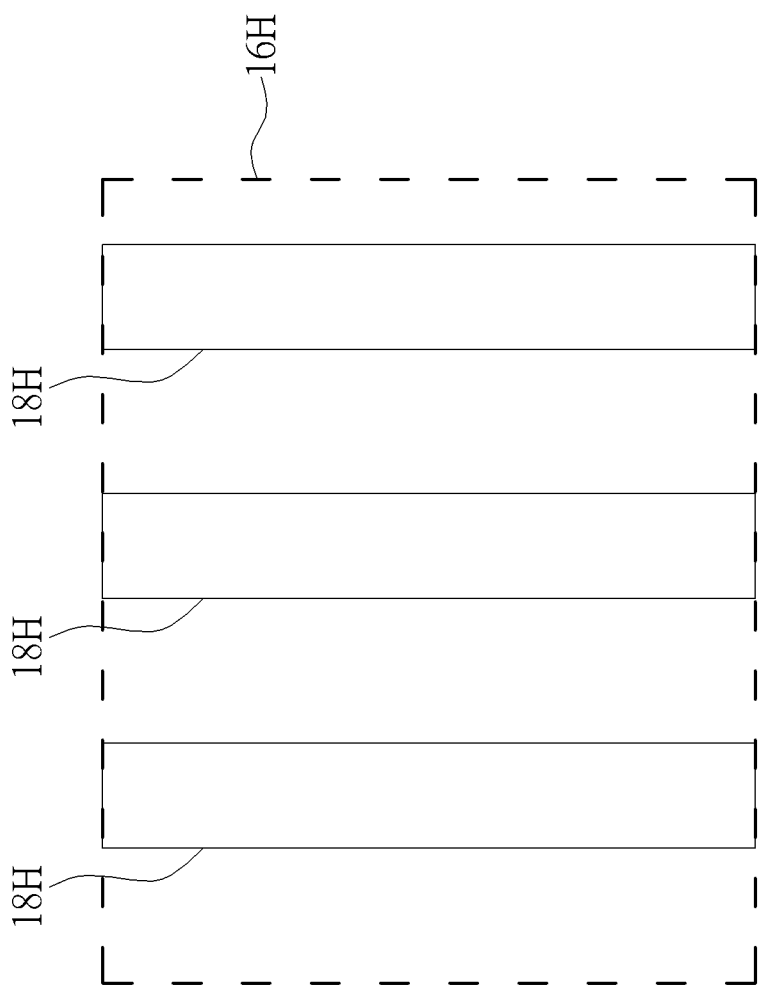
Figure 6:
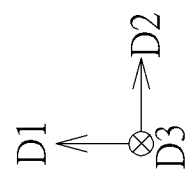
Figure 7:
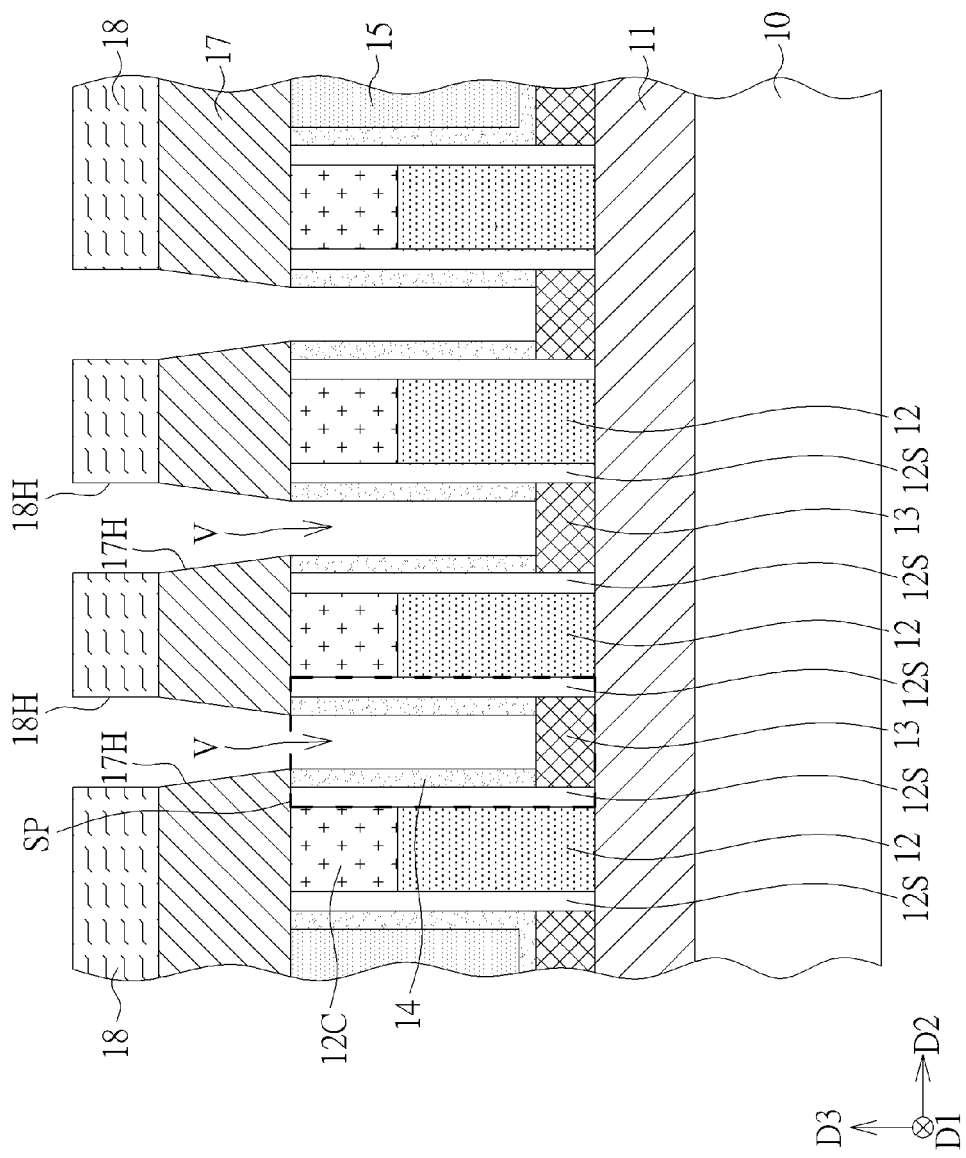

As shown in FIGS. 5-7, a second process is then performed to form at least one opening 17H penetrating the second dielectric layer 17 and exposing the air void V. The material of the second dielectric layer 17 may include silicon nitride (SiN), silicon oxynitride (SiON) or other appropriate insulating materials. Specifically, the second process may include forming a second patterned mask 18 on the second dielectric layer 17, and the second patterned mask 18 includes a plurality of second open patterns 18H. Each of the second open patterns 18H is formed corresponding to only one of the air voids V in the space SP between the gate structures 12. In other words, each of second open patterns 18H overlaps only one air void V and only one space SP between the gate structures 12. The first open pattern in the first patterned mask mentioned before may completely overlap at least two of the second open patterns 18H. For example, as shown in FIG. 6, in a position comparison between the first open pattern 16H and second open patterns 18H, the first open pattern 16H completely overlaps three of the second open patterns 18H, but the present invention is not limited to this. In other embodiments of the present invention, the first open pattern 16H may partially overlap a plurality of the second open patterns 18H. The second patterned mask 18 may be a patterned photoresist layer formed by a photolithography process, but not limited thereto. Photolithography processes with different exposure resolutions may be applied to form the second patterned mask 18 and the first patterned mask mentioned above respectively. For example, the first process may include a first exposure process for forming the first patterned mask 16 in FIG. 1, and the second process may include a second exposure process for forming the second patterned mask 18. A wavelength of light used in the second exposure process may be shorter than a wavelength of light used in the first exposure process, but not limited thereto. For instance, a deep ultraviolet (DUV) light source (a wavelength of 193 nm) may be applied in the first exposure process, and an extreme ultraviolet (EUV) light source (a wavelength of 13.5 nm) may be applied in the second exposure process, but not limited thereto. In other embodiments of the present invention, the second patterned mask 18 may also be formed by other methods such as a multiple patterning by DUV, or an e-beam maskless lithography. The dimension of the air void V in the second direction D2 may be smaller than the minimum resolution of the exposure process of forming the gate structures 12 because the sidewall spacers 12S and the contact etching stop layer 14 are also formed in the space SP between the gate structures 12, the dimension of the second open pattern 18H will be larger than or equal to the minimum resolution of the second exposure process, and that is benefit for filling conductive materials self-aligned in the air void V. Additionally, the opening 17H may have tapered sidewalls for filling conductive materials in the air void V more easily.

As shown in FIG. 7, after the step of forming the opening 17H, the second process may include an etching process configured to remove at least a part of the contact etching stop layer 14 and exposing a part of the source/drain structure 13. In the second process of this embodiment, one or multiple etching processes may be used to form the opening 17H and remove a part of the contact etching stop layer 14 respectively.

Figure 8:
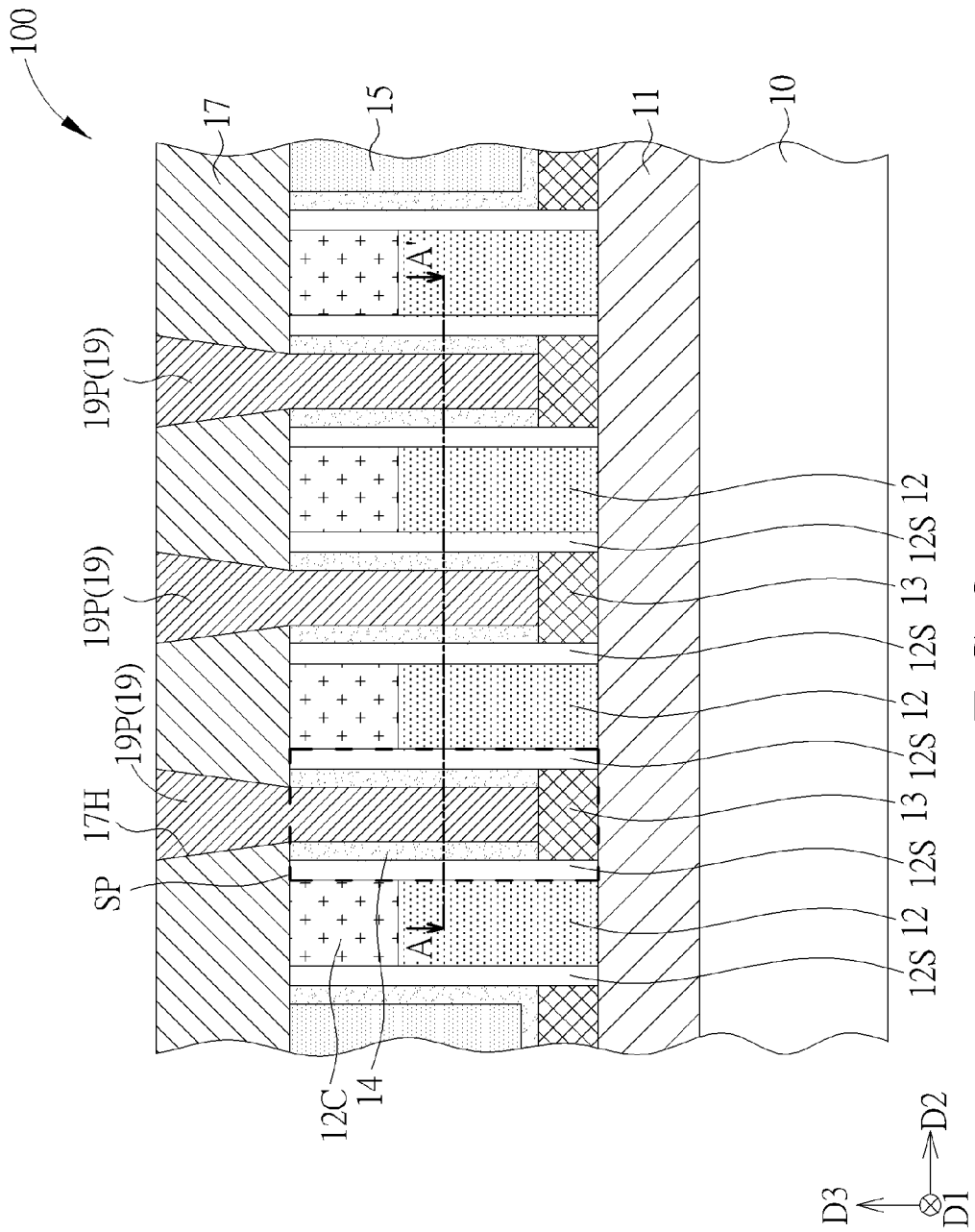

As shown in FIG. 7 and FIG. 8, the air void V exposed by the opening 17H is then filled with at least one conductive material 19 for forming a conductive structure 19P between the gate structures 12 in the second direction D2. The conductive structure 19P contacts and is electrically connected to the source/drain structure 13 after the conductive structure 19P is formed. Because the air void V is formed above the source/drain structure 13, the conductive structure 19P formed in the air void V will be self-aligned to the source/drain structure 13. The second patterned mask 18 may be removed before or after the step of forming the conductive structure 19P. The second dielectric layer 17 may also be partially or completely removed by a process such as a chemical mechanical polishing (CMP) process after the step of forming the conductive structure 19P. In addition, the conductive material 19 in the opening 17H may have a width wider than that of the conductive material 19 in the space SP, and other interconnect structures may be formed on the conductive structure 19P more easily, but not limited thereto.

Figure 9:
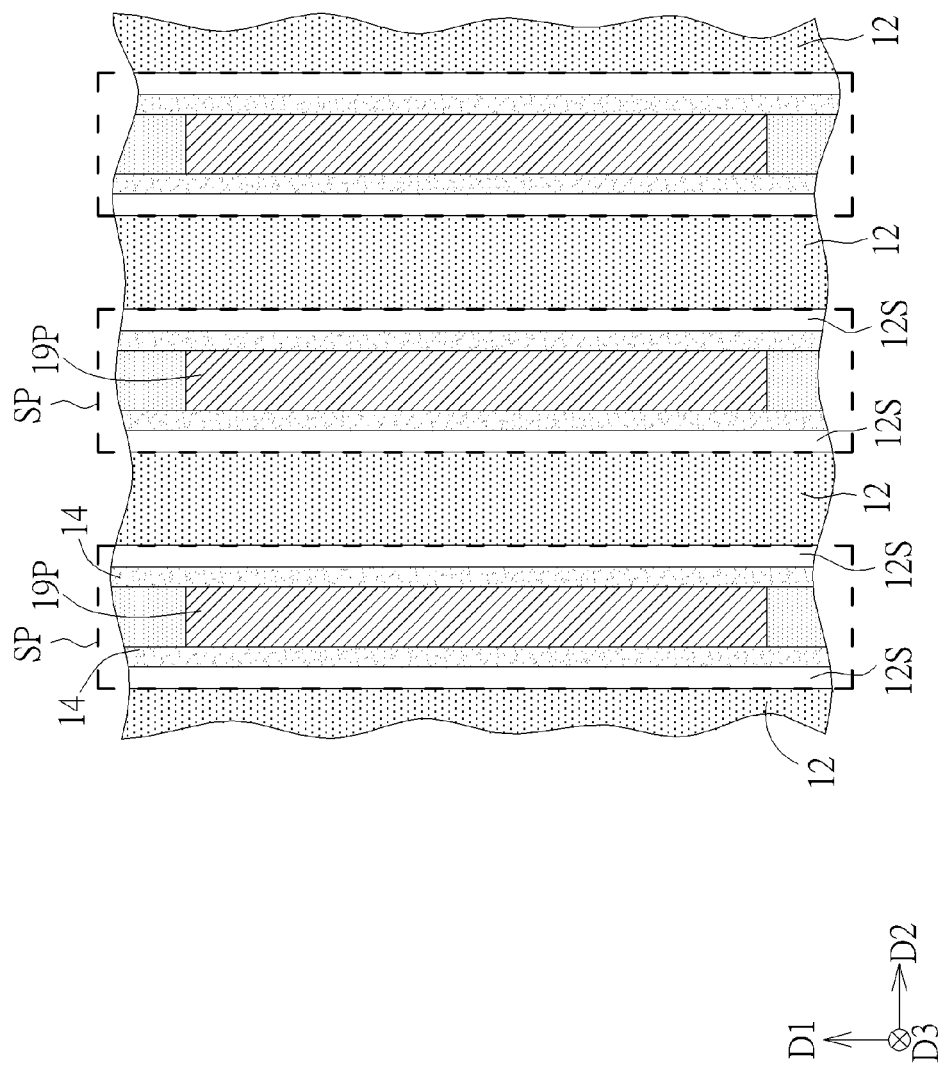

As shown in FIG. 8 and FIG. 9, a semiconductor device 100 is formed by the above-mentioned manufacturing method. In the semiconductor device 100, the conductive structure 19P extends in the first direction D1. In other words, the conductive structure 19P extends in a direction parallel to the gate structures 12. A length of the conductive structure 19P in the first direction D1 is smaller than a length of each of the gate structures 12 in the first direction D1. When the semiconductor structure 11 is a semiconductor fin structure and the gate structures 12 are gate lines, the semiconductor device 100 may be regarded as a fin field effect transistor, but the present invention is not limited to this. By the manufacturing method of this embodiment, the self-aligned conductive structure 19P may be formed in the extremely small space SP between the gate structures 12. The manufacturing yield and the process window may be enhanced accordingly.

Figure 10:
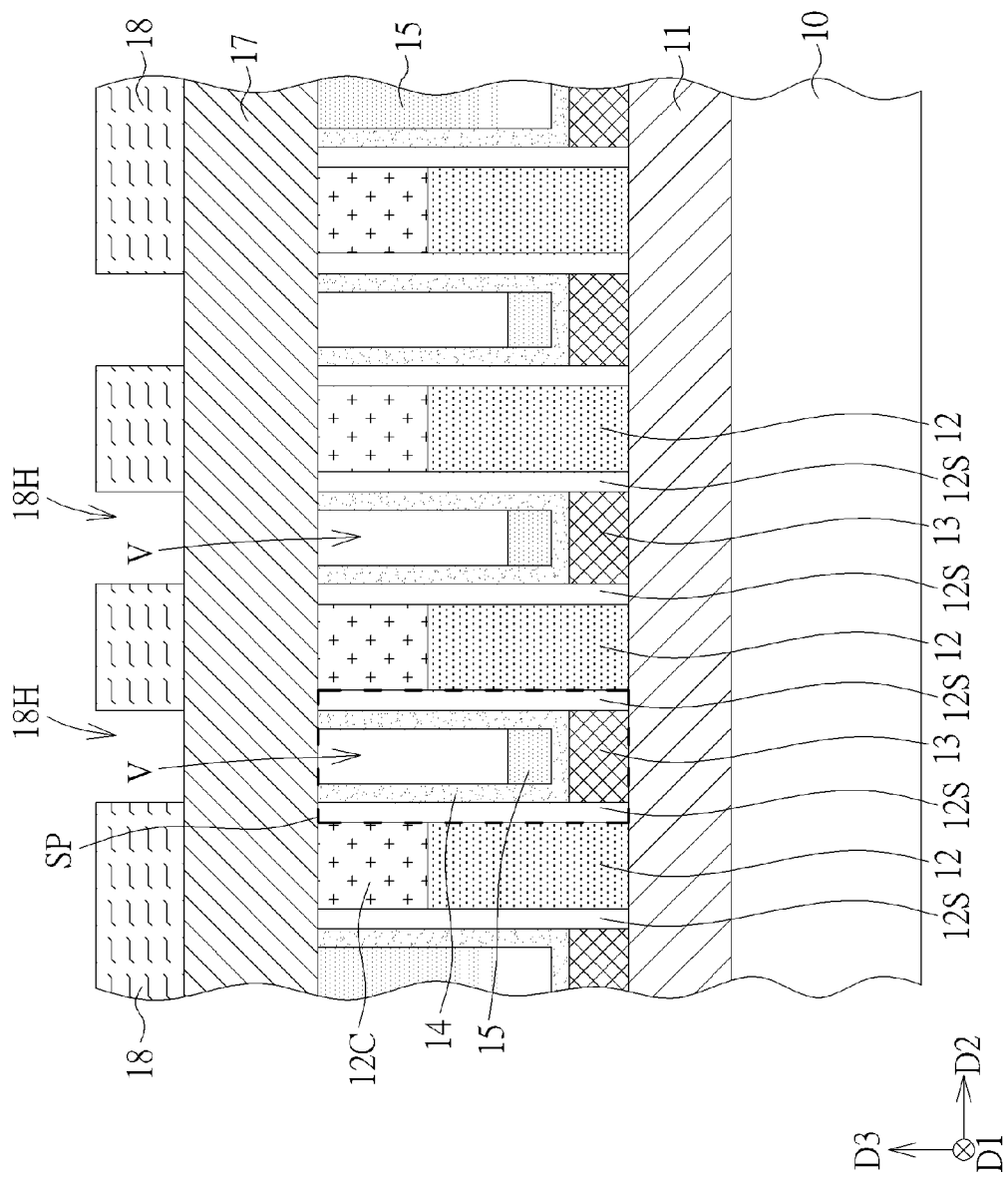
FIG. 10 is a schematic drawing illustrating a manufacturing method of a conductive structure in a semiconductor device according to a second embodiment of the present invention.

Please refer to FIG. 10 and FIG. 7. FIG. 10 is a schematic drawing illustrating a manufacturing method of a conductive structure in a semiconductor device according to a second embodiment of the present invention. FIG. 7 may also be regarded as a schematic drawing in a step subsequent to FIG. 10. As shown in FIG. 10, the difference between the manufacturing method of this embodiment and the manufacturing method of the above-mentioned first embodiment (as shown in FIG. 5) is that only a part of the first dielectric layer 15 in the space SP between the gate structures 12 is removed by the first process, and the second process includes an etching process configured to remove the first dielectric layer 15 remained in the space SP between the gate structures 12 after the first process and expose a part of the source/drain structure 13. As shown in FIG. 10 and FIG. 7, in the second process of this embodiment, one or multiple etching processes may be used to form the opening 17H, remove a part of the contact etching stop layer 14, and remove the first dielectric layer 15 remained in the space SP between the gate structures 12 after the first process respectively. In other words, the first dielectric layer 15 in the space SP between the gate structures 12 is not necessary to be completely removed by the first process, and the process window of the first process may be enhanced accordingly.

Figure 11:
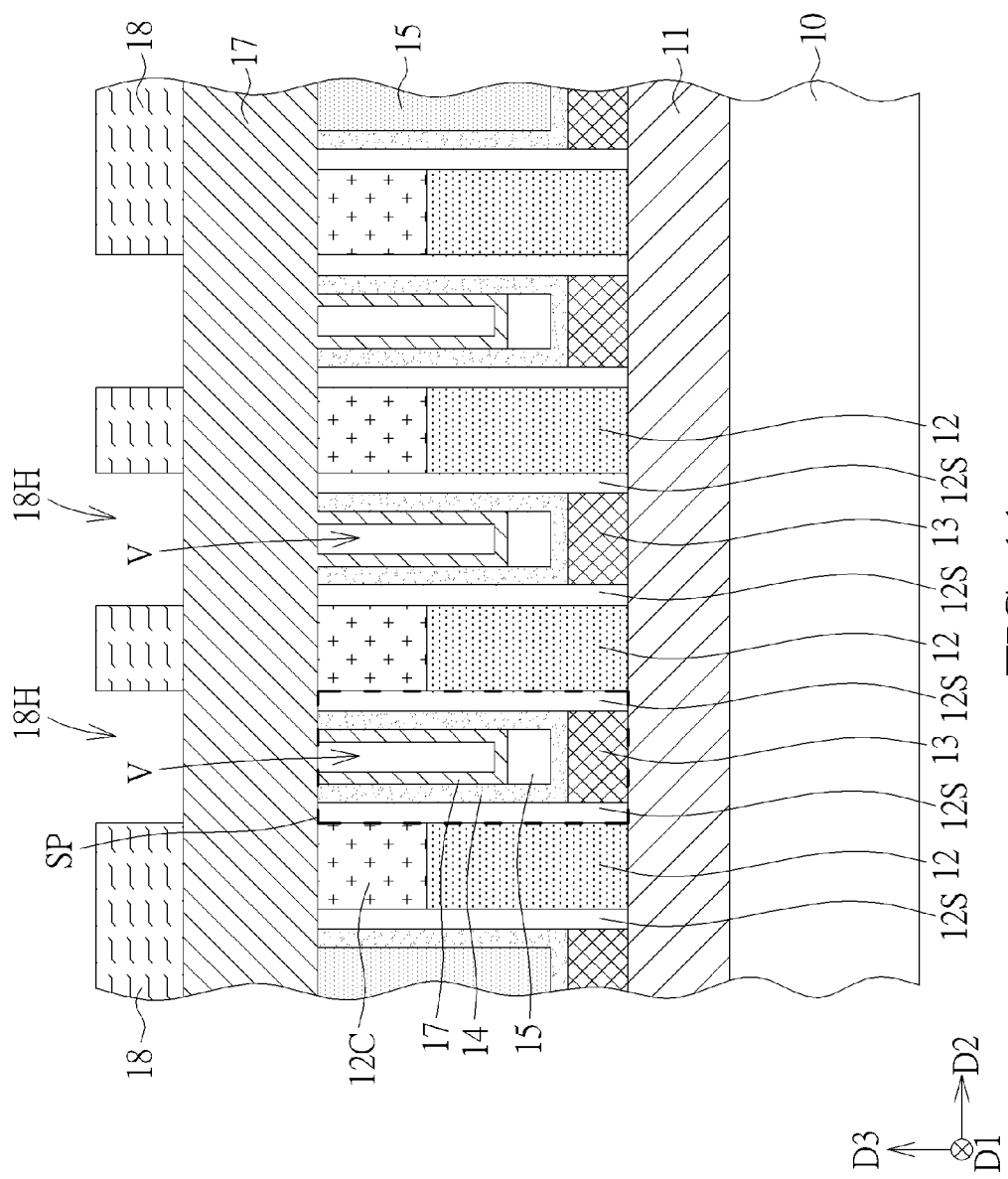
Figure 12:
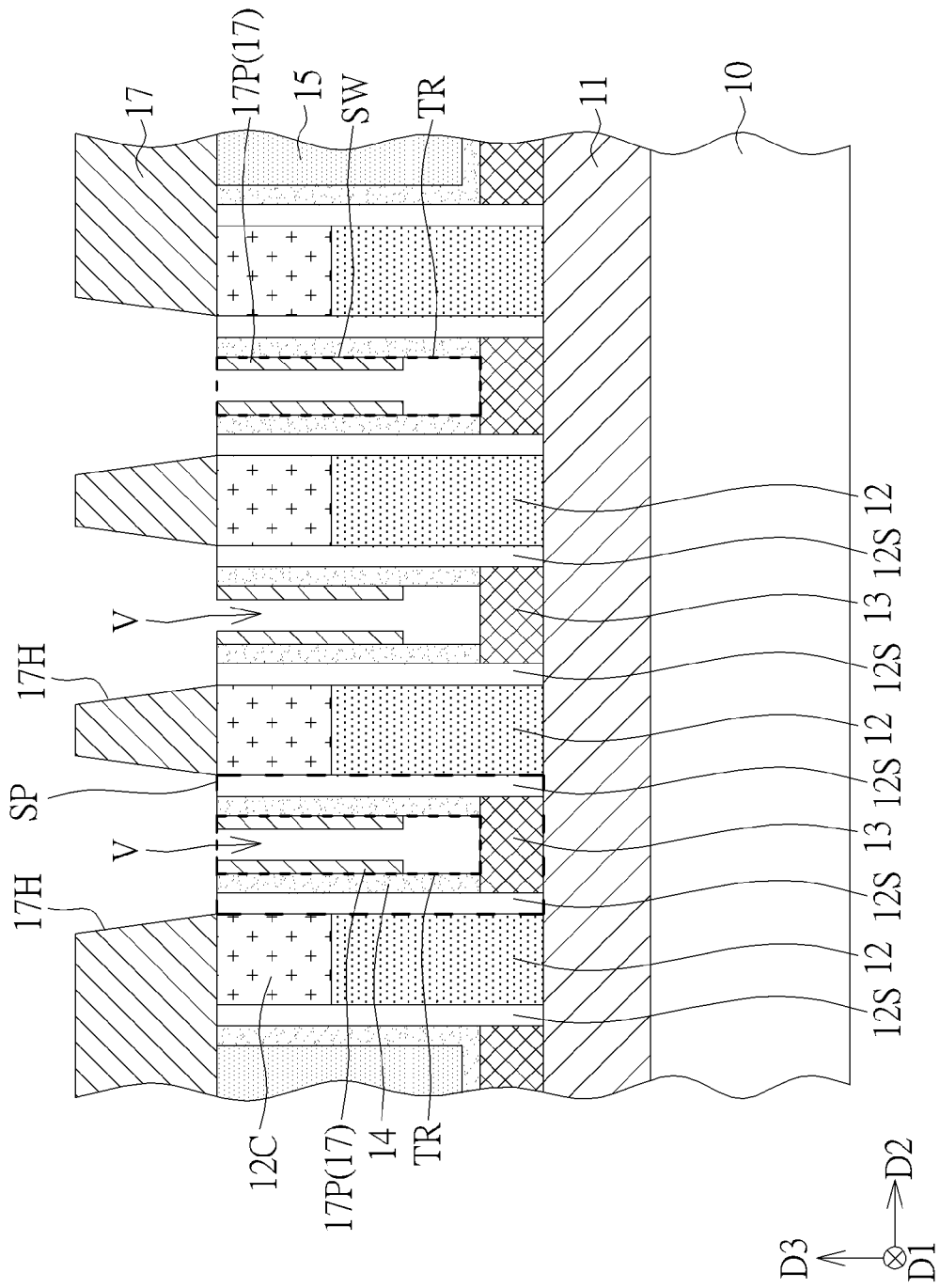
Figure 13:
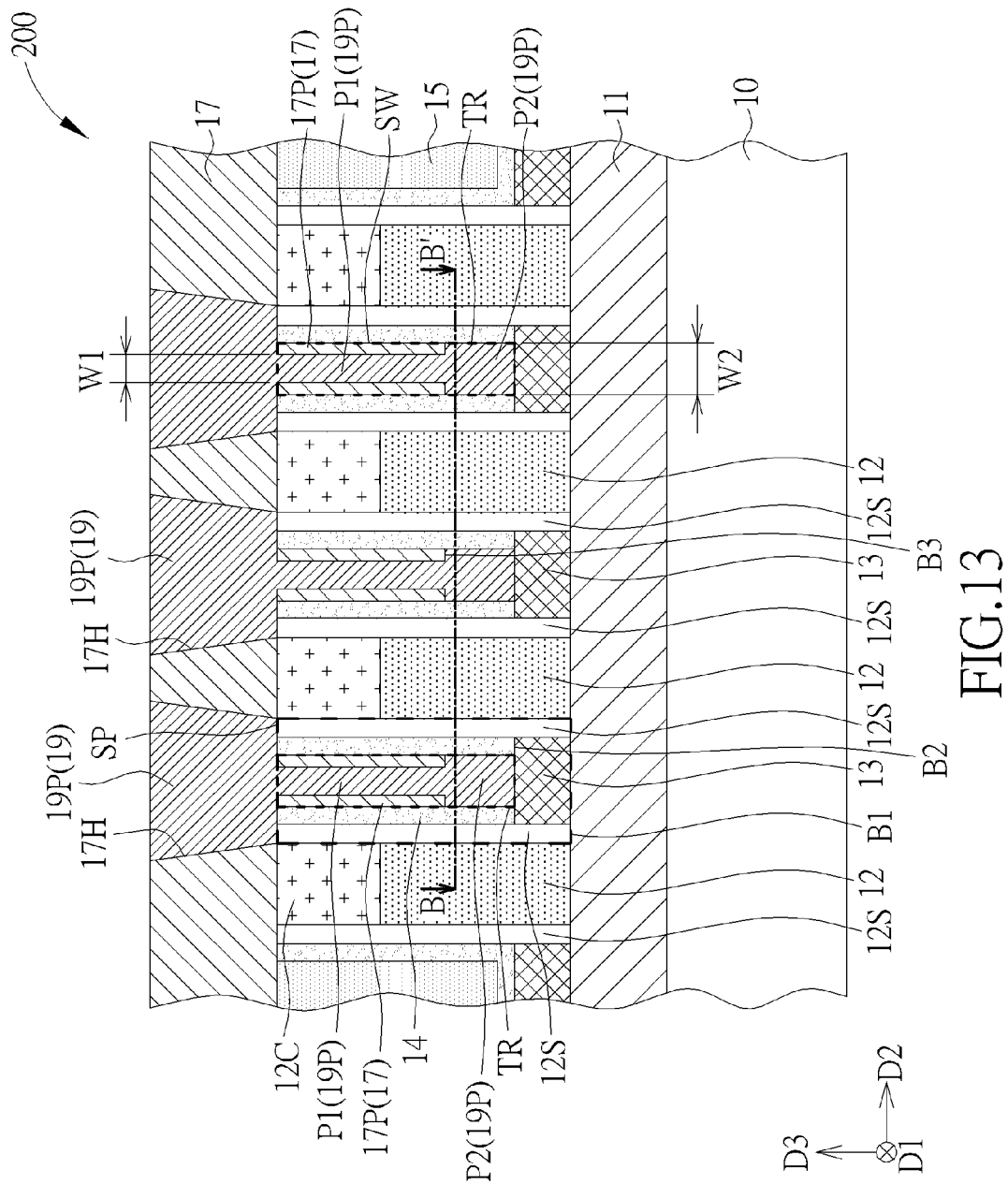

Please refer to FIGS. 11-13 and FIG. 9. FIGS. 11-13 are schematic drawings illustrating a manufacturing method of a conductive structure in a semiconductor device according to a third embodiment of the present invention. FIG. 9 may be regarded as a schematic cross-sectional drawing taken along a line B-B' in FIG. 13. As shown in FIG. 11, the difference between the manufacturing method of this embodiment and the manufacturing method of the above-mentioned second embodiment is that a part of the second dielectric layer 17 is further formed in the space SP between the gate structures 12. The air void V in the space SP may be surrounded by the second dielectric layer 17, but not limited thereto.

Subsequently, as shown in FIGS. 11-12, the second dielectric layer 17 is remained in the space SP between the gate structures 12 after the step of forming the openings 17H. It is worth noting that the remained second dielectric layer 17 may be used as a mask in the etching process configured to remove the first dielectric layer 15 remained in the space SP between the gate structures 12 after the first process and expose a part of the source/drain structure 13, but not limited thereto. The second dielectric layer 17 is remained in the space SP may be regarded as a dielectric pattern 17P formed on sidewalls SW of a trench TR formed by the contact etching stop layer 14 and the source/drain structure 13.

As shown in FIGS. 12-13, the air void V exposed by the opening 17H is then filled with the conductive material 19 for forming the conductive structure 19P between the gate structures 12 in the second direction D2. Because the air void V is formed above the source/drain structure 13, the conductive structure 19P formed in the air void V will be self-aligned to the source/drain structure 13. The second dielectric layer 17 is remained in the space SP between the gate structures 12 after the second process and the conductive structure 19P is formed, and the second dielectric layer 17 remained in the space SP surrounds at least a part of the conductive structure 19P.

As shown in FIG. 13, a semiconductor device 200 is formed by the manufacturing method of this embodiment. The semiconductor device 200 includes the semiconductor structure 11, a plurality of the gate structures 12, a plurality of the source/drain structures 13, a plurality of the trenches TR, a plurality of the dielectric patterns 17P, and a plurality of the conductive structure 19P. The gate structures 12 are disposed on the semiconductor structure 11. Each of the source/drain structures 13 is disposed between two adjacent gate structures 12. Each of the trenches TR is disposed between two adjacent gate structures 12 and corresponding to one of the source/drain structures 13. Each of the dielectric patterns is disposed on the sidewalls SW of the corresponding trench TR. Each of the conductive structure is disposed in the corresponding trench TR and electrically connected to the corresponding source/drain structure 13. Each of the conductive structures 19P includes a first portion P1 surrounded by the dielectric pattern 17P and a second portion P2 connected to the source/drain structure 13, and the first portion P1 is disposed on the second portion P2. In this embodiment, a first width W1 of the first portion P1 in the second direction D2 is smaller than a second width W2 of the second portion P2. In other words, the dielectric pattern 17P in the trench TR only surrounds an upper part of the conductive structures 19P in the trench TR, but the present invention is not limited to this. In other embodiments of the present invention, the dielectric pattern 17P formed by the second dielectric layer 17 in the trench TR may completely surround the conductive structures 19P in the trench TR by removing all of the first dielectric layer in the first process mentioned above. The semiconductor device 200 may further includes a plurality of the sidewall spacers 12S and the contact etching stop layer 14. The sidewall spacers 12S are disposed on sidewalls of each of the gate structures 12, and the contact etching stop layer 14 is disposed on a side surface of the sidewall spacer 12S. The contact etching stop layer 14 is disposed above the source/drain structure 13 in the space SP between the gate structures 12. In this embodiment, first bottom surfaces B1 of the sidewall spacers 12S directly contact the semiconductor structure 11, and a second bottom surface B2 of the contact etching stop layer 14 directly contacts the source/drain structure 13. The dielectric pattern 17P in the space SP is disposed on a side surface of the contact etching stop layer 14, and a third bottom surface B3 of the dielectric pattern 17P directly contacts the conductive structure 19P and is separated from the source/drain structure 13, but not limited thereto.

As shown in FIG. 13 and FIG. 9, in the semiconductor device 200, the gate structures 12 are disposed parallel to one another and repeatedly in a second direction D2. The conductive structure 19P extends in the first direction D1. In other words, the conductive structure 19P extends in a direction parallel to the gate structures 12. A length of the conductive structure 19P in the first direction D1 is smaller than a length of each of the gate structures 12 in the first direction D1. When the semiconductor structure 11 is a semiconductor fin structure and the gate structures 12 are gate lines, the semiconductor device 200 may be regarded as a fin field effect transistor, but the present invention is not limited to this.

Figure 14:
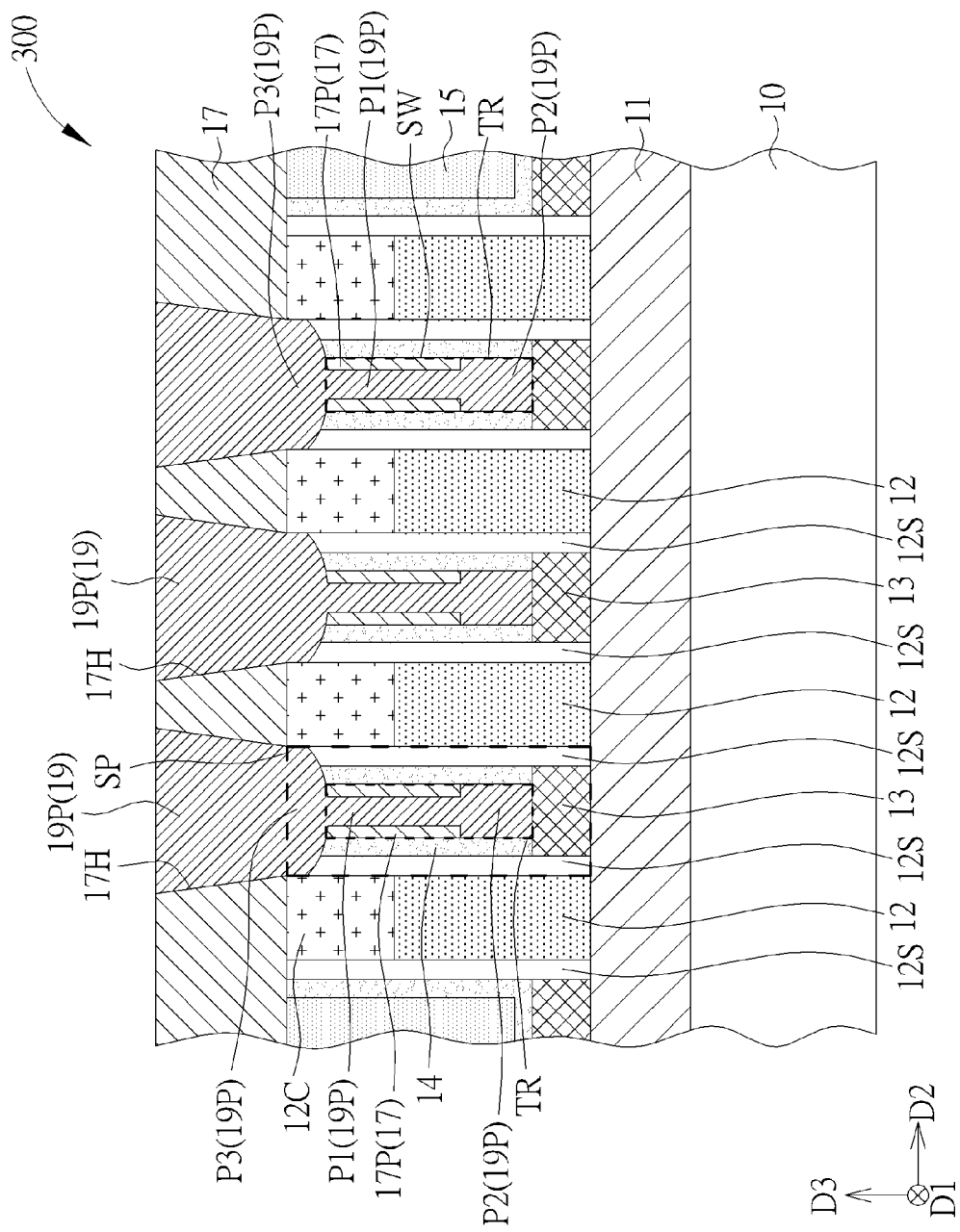
FIG. 14 is a schematic drawing illustrating a manufacturing method of a conductive structure in a semiconductor device according to a fourth embodiment of the present invention.

Please refer to FIG. 14. FIG. 14 is a schematic drawing illustrating a manufacturing method of a conductive structure in a semiconductor device 300 according to a fourth embodiment of the present invention. As shown in FIG. 14, the difference between the manufacturing method of this embodiment and the manufacturing method of the above-mentioned third embodiment is that an upper part of the sidewall spacers 12S, an upper part of the contact etching stop layer 14, and an upper part of the second dielectric layer 17 in the space SP between the gate structures 12 are removed in the second process. Therefore, the conductive structure 19P subsequently formed may further include a third portion P3 disposed above the first portion P1 in the space SP between the gate structures 12. The third portion P3 may have a half-moon or crescent shape, and a width of the third portion in the second direction D2 may be larger than a width of the second portion P2, but not limited thereto.

To summarize the above descriptions, in the manufacturing method of the conductive structure in the semiconductor device, the conductive structure between the gate structures is formed and self-aligned to the source/drain structure because the air void is formed in the space between the gate structures before the opening penetrating the second dielectric layer is formed. The manufacturing yield and the process window may be enhanced accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a semiconductor structure;
   a plurality of gate structures disposed on the semiconductor structure,
   at least one source/drain structure disposed between two adjacent gate structures;
   at least one trench disposed between the two adjacent gate structures and corresponding to the source/drain structure;
   a dielectric pattern disposed on sidewalls of the trench; and
   a conductive structure disposed in the trench and electrically connected to the source/drain structure, wherein the conductive structure comprises an first portion surrounded by the dielectric pattern and a second portion connected to the source/drain structure, and the first portion is disposed on the second portion, wherein a width of the first portion is smaller than a width of the second portion.

2. The semiconductor device of claim 1, further comprising a plurality of sidewall spacers disposed on sidewalls of each of the gate structures, wherein bottom surfaces of the sidewall spacers contact the semiconductor structure.

3. The semiconductor device of claim 2, further comprising at least one contact etching stop layer disposed on a side surface of the sidewall spacer, wherein a bottom surface of the contact etching stop layer contacts the source/drain structure.

4. The semiconductor device of claim 3, wherein the dielectric pattern is disposed on a side surface of the contact etching stop layer.

5. The semiconductor device of claim 1, wherein a length of the conductive structure is smaller than a length of each of the gate structures.

* * * * *